(12) United States Patent
Xie et al.

(10) Patent No.: US 9,475,270 B2
(45) Date of Patent: Oct. 25, 2016

(54) APPARATUS FOR STRIPPING FLEXIBLE DEVICE

(71) Applicant: BOE Technology Group Co., Ltd., Beijing (CN)

(72) Inventors: Chunyan Xie, Beijing (CN); Xiaohu Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/415,698

(22) PCT Filed: May 29, 2014

(86) PCT No.: PCT/CN2014/078849
§ 371 (c)(1),
(2) Date: Jan. 19, 2015

(87) PCT Pub. No.: WO2015/067041
PCT Pub. Date: May 14, 2015

(65) Prior Publication Data
US 2016/0016397 A1    Jan. 21, 2016

(30) Foreign Application Priority Data
Nov. 11, 2013  (CN) .......................... 2013 1 0556960

(51) Int. Cl.
*B32B 38/10* (2006.01)
*B32B 43/00* (2006.01)
*H01L 21/67* (2006.01)

(52) U.S. Cl.
CPC ....... *B32B 43/006* (2013.01); *H01L 21/67132* (2013.01); *B32B 2457/20* (2013.01);
(Continued)

(58) Field of Classification Search
CPC . B32B 43/006; B32B 38/10; Y10T 156/195; Y10T 156/1174; Y10T 156/1179; Y10T 156/1184; Y10T 156/1978; Y10T 156/1983; Y10T 156/1967
See application file for complete search history.

(56) References Cited

U.S. PATENT DOCUMENTS 8,137,502 B2 * 3/2012 Su ........................... B32B 38/10
156/702
8,409,973 B2 * 4/2013 Chida ............... H01L 21/67092
257/E21.237

(Continued)

FOREIGN PATENT DOCUMENTS

CN    101154561 A    4/2008
CN    201107511 Y    8/2008

(Continued)

OTHER PUBLICATIONS

Nov. 4, 2015—(CN)—First Office Action Appn 201310556960.1 with English Tran.

(Continued)

*Primary Examiner* — Mark A Osele
(74) *Attorney, Agent, or Firm* — Banner & Witcoff, Ltd.

(57) ABSTRACT

A apparatus for stripping flexible device including: a chassis; a stage; a pick-up device mounted on the chassis through a pivot shaft parallel to a bearing surface, the pick-up device being movable with respect to the stage along a direction perpendicular to a rotation axis of the pivot shaft and parallel with the bearing surface of the stage, and having a surface facing the stage, and having a fixing mechanism configured to fasten a lateral side of the flexible device; an auxiliary device which is mounted on the chassis, an end part of the auxiliary device providing a force to the flexible substrate for its separation from the carrier plate at a separation position between the flexible substrate of the flexible device and the carrier plate when the flexible device is picked up from the carrier plate by the pick-up device; a first driving device mounted on the chassis.

20 Claims, 2 Drawing Sheets

(52) U.S. Cl.
CPC ...... *Y10T156/1174* (2015.01); *Y10T 156/1179* (2015.01); *Y10T 156/195* (2015.01); *Y10T 156/1978* (2015.01); *Y10T 156/1983* (2015.01)

(56) References Cited

U.S. PATENT DOCUMENTS

| | | | |
|---|---|---|---|
| 8,951,387 B2* | 2/2015 | Kang | B29C 63/0013 156/712 |
| 2006/0199382 A1* | 9/2006 | Sugiyama | H01L 21/67132 438/670 |
| 2008/0113486 A1 | 5/2008 | Eguchi et al. | |
| 2008/0236743 A1* | 10/2008 | Kye | B29C 63/0013 156/714 |
| 2010/0051191 A1 | 3/2010 | Lee et al. | |
| 2011/0041993 A1 | 2/2011 | Furuya et al. | |
| 2012/0168066 A1 | 7/2012 | Eguchi et al. | |
| 2016/0159069 A1* | 6/2016 | Huang | B32B 43/006 156/707 |

FOREIGN PATENT DOCUMENTS

| | | | | |
|---|---|---|---|---|
| CN | 101254681 A | | 9/2008 | |
| CN | 103560101 A | | 2/2014 | |
| DE | 19720845 A1 | * | 11/1998 | ............... B09B 5/00 |
| JP | 2000086080 A | | 3/2000 | |
| JP | 2006201680 A | | 8/2006 | |
| WO | WO 2011077854 A1 | * | 6/2011 | ........... B32B 43/006 |
| WO | WO 2013024804 A1 | * | 2/2013 | ........... B32B 43/006 |

OTHER PUBLICATIONS

International Search Report and Written Opinion mailed Sep. 9, 2009 (PCT/CN2014/078849); ISA/CN.

May 17, 2016—International Preliminary Report on Patentability Appn PCT/CN2014/078849.

* cited by examiner

APPARATUS FOR STRIPPING FLEXIBLE DEVICE

The application is a U.S. National Phase Entry of International Application PCT/CN2014/078849 filed on May 29, 2014, designating the United States of America and claiming priority to Chinese Patent Application No. 201310556960.1, filed on Nov. 11, 2013. The present application claims priority to and the benefit of the above-identified applications and the above-identified applications are incorporated by reference herein in their entirety.

TECHNICAL FIELD

Embodiments of the present disclosure relate to an apparatus for stripping a flexible device.

BACKGROUND

Flexible devices have advantages such as lightness, thinness, flexibility and resistance to impact.

Currently, in the technology of manufacturing a flexible device, generally a flexible substrate is assembled on a carrier plate such as a glass substrate, then display elements are manufactured on the flexible substrate, and then the flexible substrate is separated from the carrier plate to obtain the flexible device.

During manufacturing a flexible device, the crucial technology in the field of flexible display technology is how to separate the flexible substrate from the carrier plate for manufacturing the flexible device.

In a conventional technology, when the flexible substrate and the carrier plate are separated from each other, it is possible to take the flexible substrate off the carrier plate by a mechanical stripping after the carrier plate is cut by a glass blade. However, when the mechanical stripping is used, a sharp angle will be formed on a contact surface between the mechanical apparatus and the flexible substrate regardless whether a vacuum adhesion or a glue face adhesion is used when separating the flexible substrate and the carrier plate, in such a way that a linear tension concentration phenomenon is produced within the flexible device, easily causing damages to the flexible device.

SUMMARY

At least one embodiment of the present disclosure provides the following technical solutions.

A apparatus for stripping a flexible device comprising:
a chassis;
a stage mounted on the chassis;
a pick-up device located above a bearing surface of the stage and mounted on the chassis through a pivot shaft parallel to the bearing surface of the stage, the pick-up device being movable with respect to the stage along a direction perpendicular to a rotation axis of the pivot shaft and parallel with the bearing surface of the stage, and having a surface facing the stage which is an arc face taking the rotation axis of the pivot shaft as a center axis, and the pick-up device including a fixing mechanism configured to fasten a lateral side of the flexible device;
an auxiliary device which is mounted on the chassis and is movable with respect to the stage along the direction perpendicular to the rotation axis of the pivot shaft and parallel to the bearing surface of the stage, an end part of the auxiliary device being configured to provide a force to a flexible substrate of the flexible device for its separation from the carrier plate at a separation position between the flexible substrate and the carrier plate; and
a first driving device mounted on the chassis and configured to drive the pick-up device to move with respect to the stage.

When the above apparatus for stripping the flexible device is used to peel the flexible device from the carrier plate, the carrier plate bearing the flexible device is fixed to the bearing surface of the stage, and a side of the flexible device is fastened to the pick-up device by a fixing mechanism of the pick-up device 4, and then the first driving device is controlled to drive the pick-up device to move with respect to the stage along a direction perpendicular to a rotation axis of the pivot shaft and parallel with the bearing surface of the stage while the pick-up device rotates around the rotation axis of the pivot shaft; since a surface of the pick-up device facing the stage is an arc face taking the rotation axis of the pivot shaft as a center axis, the pick-up device maintain a constant interval with the bearing surface of the stage while rotating around the rotation axis of the pivot axis, under which circumstances, an end part of the auxiliary device is located on the side where the flexible device has curled up, and provides a force to the flexible substrate for its separation from the carrier plate at the separation position of the flexible substrate of the flexible device and the carrier plate 71. Therefore, a force is applied by both the pick-up device and the auxiliary device when the flexible device is stripped off the carrier plate, so that a forced asserted to the flexible device by the pick-up device is decreased and in turn the tension concentration phenomenon caused to the flexible device by the pick-up device is alleviated, and in this way, the damage to flexible device is reduced.

Accordingly, the apparatus for stripping the flexible device provided by the present disclosure reduces damages to the flexible device when stripping off the carrier plate the flexible device.

According to an embodiment of the present disclosure, the chassis comprises:
a body, which the stage is fixed to;
a bracket fixed to the body; and
a slider fitted to the bracket in a manner of being slidable with respect to the bracket;
wherein, the pick-up device is pivotably mounted on the slider through the pivot shaft, and the auxiliary device is mounted on the slider; the first driving device is mounted on the bracket.

Accordingly to an embodiment of the present disclosure, the slider and the bracket can be fitted to each other by at least a set of sliding groove and sliding rail which are slidably fitted.

Accordingly to an embodiment of the present disclosure, the chassis comprises:
a body, the stage being slidably fitted on the body, the first driving device being mounted on the body and configured to drive the stage to slide with respect to the body of the chassis;
a first bracket fixed to the body, the pick-up device pivotably connected to the first bracket through the pivot shaft;
a second bracket fixed to the body, the auxiliary device being mounted on the second bracket.

Accordingly to an embodiment of the present disclosure, the first driving device comprises a screw drive device.

Accordingly to an embodiment of the present disclosure, the pick-up device is a roller which has a center axis coinciding with the center axis of the pivot shaft.

Accordingly to an embodiment of the present disclosure, the fixing mechanism is a vacuum suction device in which a suction opening is located on a face of the pick-up device facing the stage.

Accordingly to an embodiment of the present disclosure, the fixing mechanism is a glue tape provided on a face of the pick-up device facing the stage.

Accordingly to an embodiment of the present disclosure, an end part of the auxiliary device is an air knife having a jet nozzle facing the separation position of the flexible substrate and the carrier plate.

Accordingly to an embodiment of the present disclosure, an end part of the auxiliary device is a flexible cut sheet having an outer end in contact with the separation position of the flexible substrate and the carrier plate and having a wedge structure.

Accordingly to an embodiment of the present disclosure, the apparatus for stripping the flexible device further comprises: a second driving device configured to drive the pick-up device to rotate around the rotation axis of the pivot shaft.

Accordingly to an embodiment of the present disclosure, the second driving device is a driving motor which is mounted in a manner that the output shaft thereof is coaxially fixed with the pivot shaft.

The apparatus for stripping the flexible device according to at least one embodiment of the present disclosure reduces damages to the flexible device when stripping off the carrier plate the flexible device.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
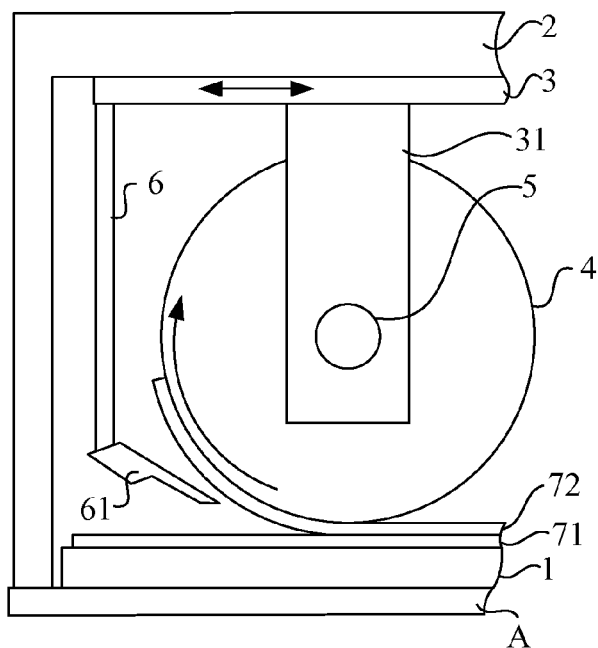
FIG. 1 is a structural diagram of a apparatus for stripping a flexible device according to an embodiment of the present disclosure in which a pick-up device has a circular cross section.
Figure 2:
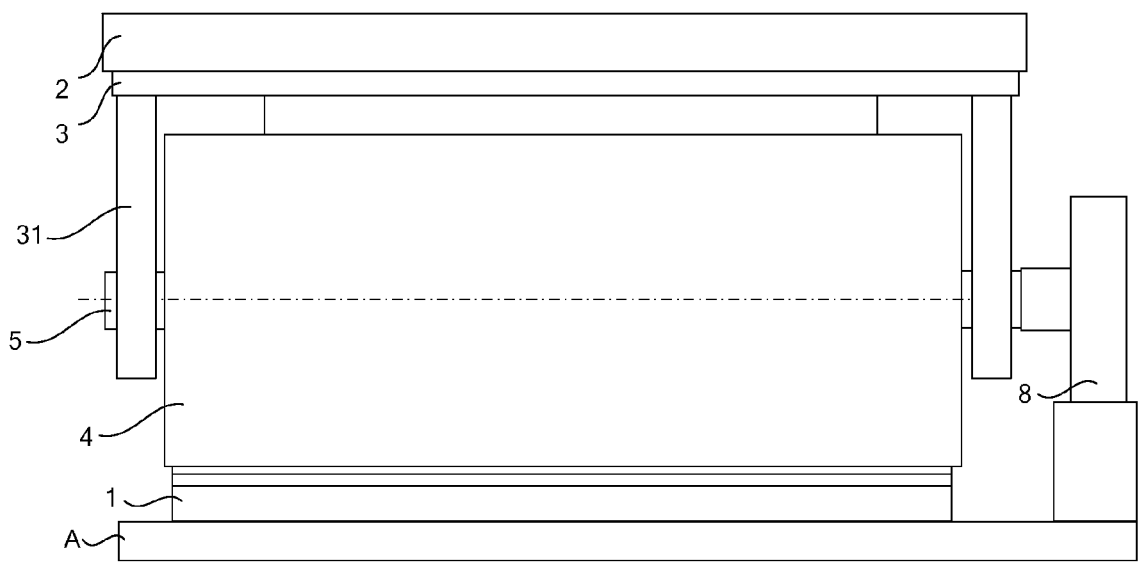
FIG. 2 is a right side view of the apparatus for stripping the flexible device as illustrated in FIG. 1.

Please refer to FIG. 1 and FIG. 2, FIG. 1 is a structural diagram of an apparatus for stripping a flexible device according to an embodiment of the present disclosure in which a pick-up device has a circular cross section; FIG. 2 is a right side view of the apparatus for stripping the flexible device as illustrated in FIG. 1.

As illustrated in FIG. 1, the apparatus for stripping the flexible device according to the embodiment of the present disclosure comprises:

a chassis A;

a stage 1 mounted on the chassis A, having a bearing surface for loading a carrier plate 71 with a flexible device 72;

the apparatus for stripping the flexible device further comprises a pick-up device 4 located above the bearing surface of the stage 1 and mounted on the chassis A through a pivot shaft 5. The pivot shaft 5 is parallel to the bearing surface of the stage 1. The pick-up device 4 is movable with respect to the stage 1 along a direction perpendicular to a rotation axis of the pivot shaft 5 and parallel with the bearing surface of the stage 1. The pick-up device 4 has a surface facing the stage 1 which is an arc face taking the rotation axis of the pivot shaft 5 as a center axis, and has a fixing mechanism configured to fasten a lateral side of the flexible device 72.

The apparatus for stripping the flexible device further comprises an auxiliary device 6 which is mounted on the chassis A. The auxiliary device 6 is movable with respect to the stage 1 along a direction perpendicular to the rotation axis of the pivot shaft 5 and parallel to the bearing surface of the stage 1. Upon the flexible device 72 being picked up from the carrier plate 71 by the pick-up device 4, an end part 61 of the auxiliary device 6 provides a force to separate the flexible substrate from the carrier plate 71 at a joint between the flexible substrate of the flexible device 72 and the carrier plate 71.

The apparatus for stripping the flexible device further comprises a first driving device mounted on the chassis A and configured to drive the pick-up device 4 to move with respect to the stage 1.

Upon the above apparatus for stripping the flexible device being used to stripe the flexible device 72 from the carrier plate 71, the carrier plate 71 bearing the flexible device 72 is fixed to the bearing surface of the stage 1, and a lateral side of the flexible device 72 is fastened to the pick-up device 4 by the fixing mechanism of the pick-up device 4, and then the first driving device drives the pick-up device 4 to move with respect to the stage 1 along a direction perpendicular to the rotation axis of the pivot shaft 5 and parallel with the bearing surface of the stage 1 while the pick-up device rotates around the rotation axis of the pivot shaft 5. Since the surface of the pick-up device 4 facing the stage 1 is an arc face taking the rotation axis of the pivot shaft 5 as a center axis, the pick-up device 4 maintains a constant interval with the bearing surface of the stage 1 while rotating around the rotation axis of the pivot axis 5. In this case, the end part 61 of the auxiliary device 6 is located on the side where the flexible substrate of the flexible device 72 has curled up and between the pick-up device 4 and the stage 1, and provides a force to separate the flexible substrate of the flexible device 72 from the carrier plate 71 at where the flexible substrate of the flexible device 72 is separated from the carrier plate 71. Therefore, the force is applied by both the pick-up device 4 and the auxiliary device 6 when the flexible device 72 is stripped off the carrier plate 1, so that the force asserted to the flexible device 72 by the pick-up device 4 while picking up the flexible device 72 is decreased and in turn the tension concentration phenomenon on the flexible device 71 cased by the pick-up device 4 is alleviated. In this way, the damage to flexible device 72 is decreased.

Accordingly, the apparatus for stripping the flexible device according to the embodiment of the present disclosure decrease the damage on the flexible device 72 when the flexible device 72 is stripped off the carrier plate 71.

The relative movement between the pick-up device 4 and the stage 1 mentioned in the above embodiments can be achieved in various manners.

In a first manner, as illustrated in FIGS. 1 and 2, the chassis A comprises:

a body, which a stage 1 is fixed to;
a bracket 2 fixed to the body; and
a slider 3 slidably mounted on the bracket 2.

The pick-up device 4 is pivotably mounted on the slider 3 through a pivot shaft 5 and the auxiliary device 6 is also mounted on the slider 3; the first driving device is mounted on the bracket 2 to drive the slider 3 to slide with respect to the bracket 2, so as to obtain the relative movement between the pick-up device 4 and the stage 1.

As illustrated in FIG. 2, the slider 3 has two blocking bars 31 extending downward with the pick-up device 4 positioned therebetween, and two ends of the pick-up device 4 are pivotably mounted on the two blocking bars 3 through the pivot shaft 5.

Optionally, the slider 3 and the bracket 2 can be connected to each other by at least a set of sliding groove and sliding rail which are slidably fitted.

Figure 4:
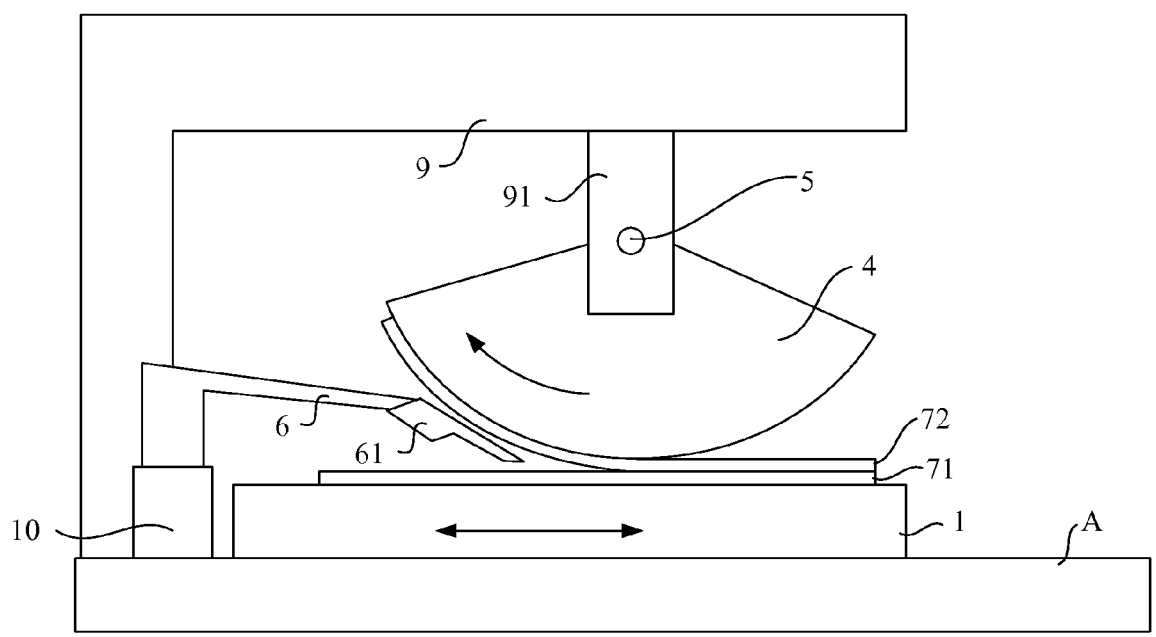
FIG. 4 is a structural diagram of an apparatus for stripping a flexible device according to an embodiment of the present disclosure in which a stage and a chassis body are glidingly fitted.

In a second manner, as illustrated in FIG. 4, the chassis A comprises:

a body which the stage 1 is slidably fitted to, a first driving device being mounted on the body of the chassis A and configured to drive the stage 1 to slide with respect to the body;

a first bracket 9 fixed to the body, the pick-up device 4 being pivotably connected to the first bracket 9 through a pivot shaft 5;

a second bracket 10 fixed to the body, the auxiliary device 6 being mounted on the second bracket 10.

The technical solution of the above second manner can be achieved by the relative movement between the pick-up device 4 and the stage 1.

In the above second manner, for example, two blocking bars 91 can be extended on the side of the first bracket 9 facing the stage 1 with the pick-up device 4 located therebetween, and two ends of the pick-up device 4 are pivotably mounted through the pivot shaft 5, so as to achieve a pivot connection between the pick-up device 4 and the first bracket 9.

The first driving device driving the slider 3 to slide with respect to the bracket 2 mentioned in the first manner can utilize various driving devices, such as a driving motor mounted on the bracket 2, a driving gear coaxially fixed with the output shaft of the driving motor, a rack mounted on the slider 3; or an oil cylinder etc. The above first driving device can further comprise a screw drive device in which the driving motor is mounted on the bracket 2, the screw is coaxially fixed on the output shaft of the driving motor and pivotably mounted on the bracket 2, and the slider 3 has a threaded hole screw-thread fitted with the screw.

The first driving device can also utilize other arrangement which will not be listed specifically.

In one embodiment, the pick-up device can also have various structures. As illustrated in FIG. 1, the pick-up device 4 for the flexible device can be a roller having a center axis coinciding with that of the pivot shaft 5.

Figure 3:
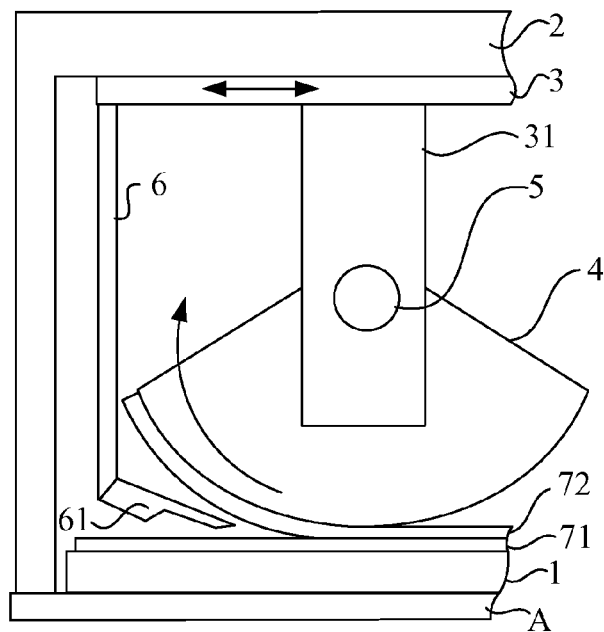
FIG. 3 is a structural diagram of an apparatus for stripping a flexible device provided by an embodiment of the present disclosure in which a pick-up device has a sector cross section.

Optionally, the cross section of the pick-up device 4 can also be of a fan shape, as illustrated in FIG. 3.

In one embodiment, the fixing mechanism of the pick-up device 4 can be a vacuum suction device provided on the side of the pick-up device 4 facing the stage 1.

The fixing mechanism of the pick-up device 4 can also be a glue tape provided on the side of the pick-up device 4 facing the stage 1.

In one embodiment, the end part 61 of the auxiliary device 6 can be an air knife which has a jet nozzle facing toward the separation position of the flexible substrate of the flexible device 72 with the carrier plate 71. By adjusting parameters such as an intensity, an air jetting width and an air jetting direction of the air flow jetted at the jet nozzle of the air knife etc., the air flow travels along the separation position between the flexible substrate of the flexible device 72 and the carrier plate 71, so that a force is provided to the flexible substrate for its separation from the carrier plate 71.

In one embodiment, the end part 61 of the auxiliary device 6 is a flexible cut sheet which has an outer end in contact with the separation position of the flexible substrate of the flexible device 72 and the carrier plate 71 and in a shape of wedge.

The outer end of the flexible cut sheet has a wedge structure to form a guide surface, which can raise the flexible substrate of the flexible device 72 toward the direction away from the carrier plate 71 so as to provide a force to the flexible substrate for its separation from the carrier plate 71.

In the above embodiment, the friction force between the pick-up device 4 and the flexible device 72 drives the pick-up device 4 to rotate around the pivot shaft 5. Of course, the above apparatus for stripping the flexible device further comprises a second driving device 8 configured to drive the pick-up device 4 to rotate around the rotation axis of the pivot shaft 5, as illustrated in FIG. 2.

In one embodiment, the above second driving device 8 can be a driving motor which is mounted in a manner that the output shaft thereof is coaxially fixed with the pivot shaft 5.

The foregoing is merely exemplary embodiments of the invention, but is not used to limit the protection scope of the invention. The protection scope of the invention shall be defined by the attached claims.

The present disclosure claims priority of Chinese Patent Application No. 201310556960.1 filed on Nov. 11, 2013, the disclosure of which is hereby entirely incorporated by reference.

The invention claimed is:

1. An apparatus for stripping a flexible device comprising:
a chassis;
a stage mounted on the chassis;
a pick-up device located above a bearing surface of the stage and mounted on the chassis through a pivot shaft parallel to the bearing surface of the stage, the pick-up device being movable with respect to the stage along a direction perpendicular to a rotation axis of the pivot shaft and parallel with the bearing surface of the stage, and having a surface facing the stage which is an arc face taking the rotation axis of the pivot shaft as a center axis, and the pick-up device including a fixing mechanism configured to fasten a lateral side of the flexible device;
an auxiliary device which is mounted on the chassis and is movable with respect to the stage along the direction perpendicular to the rotation axis of the pivot shaft and parallel to the bearing surface of the stage, an end part of the auxiliary device being configured to provide a force to a flexible substrate of the flexible device for its separation from the carrier plate at a separation position between the flexible substrate and the carrier plate; and a first driving device mounted on the chassis and configured to drive the pick-up device to move with respect to the stage, wherein a relative position of the pivot shaft and the auxiliary device is fixed.

2. The apparatus for stripping flexible device according to claim 1, wherein the chassis comprises:

a body, which the stage is fixed to;

a bracket fixed to the body; and a slider fitted to the bracket in a manner of being slidable with respect to the bracket;

wherein the pick-up device is pivotably mounted on the slider through the pivot shaft, and the auxiliary device is mounted on the slider; the first driving device is mounted on the bracket.

3. The apparatus for stripping flexible device according to claim 2, wherein the slider and the bracket can be fitted to each other by at least a set of sliding groove and sliding rail which are slidably fitted.

4. The apparatus for stripping flexible device according to claim 1, wherein the chassis comprises:

a body, the stage being slidably fitted on the body, the first driving device being mounted on the body and configured to drive the stage to slide with respect to the body of the chassis;

a first bracket fixed to the body, the pick-up device pivotably connected to the first bracket through the pivot shaft; and a second bracket fixed to the body, the auxiliary device being mounted on the second bracket.

5. The apparatus for stripping flexible device according to claim 1, wherein the first driving device comprises a screw drive device.

6. The apparatus for stripping flexible device according to claim 1, wherein the pick-up device is a roller which has a center axis coinciding with the center axis of the pivot shaft.

7. The apparatus for stripping flexible device according to claim 1, wherein the fixing mechanism is a vacuum suction device in which a suction opening is located on a face of the pick-up device facing the stage.

8. The apparatus for stripping flexible device according to claim 1, wherein the fixing mechanism is a glue tape provided on a face of the pick-up device facing the stage.

9. The apparatus for stripping flexible device according to claim 1, wherein an end part of the auxiliary device is an air knife having a jet nozzle facing the separation position of the flexible substrate and the carrier plate.

10. The apparatus for stripping flexible device according to claim 1, wherein an end part of the auxiliary device is a flexible cut sheet having an outer end in contact with the separation position of the flexible substrate and the carrier plate and having a wedge structure.

11. The apparatus for stripping flexible device according to claim 1, further comprising: a second driving device configured to drive the pick-up device to rotate around the rotation axis of the pivot shaft.

12. The apparatus for stripping flexible device according to claim 11, wherein the second driving device is a driving motor which is mounted in a manner that the output shaft thereof is coaxially fixed with the pivot shaft.

13. The apparatus for stripping flexible device according to claim 2, wherein the first driving device comprises a screw drive device.

14. The apparatus for stripping flexible device according to claim 2, wherein the pick-up device is a roller which has a center axis coinciding with the center axis of the pivot shaft.

15. The apparatus for stripping flexible device according to claim 2, wherein the fixing mechanism is a vacuum suction device in which a suction opening is located on a face of the pick-up device facing the stage.

16. The apparatus for stripping flexible device according to claim 2, wherein the fixing mechanism is a glue tape provided on a face of the pick-up device facing the stage.

17. The apparatus for stripping flexible device according to claim 2, wherein an end part of the auxiliary device is an air knife having a jet nozzle facing the separation position of the flexible substrate and the carrier plate.

18. The apparatus for stripping flexible device according to claim 2, wherein an end part of the auxiliary device is a flexible cut sheet having an outer end in contact with the separation position of the flexible substrate and the carrier plate and having a wedge structure.

19. The apparatus for stripping flexible device according to claim 2, further comprising:

a second driving device configured to drive the pick-up device to rotate around the rotation axis of the pivot shaft.

20. The apparatus for stripping flexible device according to claim 3, wherein the first driving device comprises a screw drive device.

* * * * *